(12) United States Patent
Tateda et al.

(10) Patent No.: US 10,587,213 B2
(45) Date of Patent: Mar. 10, 2020

(54) MOTOR DRIVE APPARATUS TO DETECT OCCURRENCE OF LEAKAGE CURRENT

(71) Applicant: FANUC CORPORATION, Yamanashi (JP)

(72) Inventors: Masaya Tateda, Yamanashi (JP); Yasuyuki Matsumoto, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/982,433

(22) Filed: May 17, 2018

(65) Prior Publication Data

US 2018/0351494 A1 Dec. 6, 2018

(30) Foreign Application Priority Data

May 30, 2017 (JP) ................................ 2017-106829

(51) Int. Cl.
*H02P 11/04* (2006.01)
*G01R 31/40* (2014.01)
*H02P 29/024* (2016.01)
*G01R 31/02* (2006.01)
(Continued)

(52) U.S. Cl.
CPC ............ *H02P 11/04* (2013.01); *G01R 31/025* (2013.01); *G01R 31/40* (2013.01); *H02P 7/28* (2013.01); *H02P 29/0241* (2016.02); *G01R 19/16571* (2013.01)

(58) Field of Classification Search
CPC .......... H02M 1/32; H02M 1/36; H02M 7/537; H02M 7/53871; H02M 5/458; H02M 5/4585; H02M 5/40; H02M 5/42; G01R 19/16571; G01R 31/025; G01R 31/345; G01R 19/0092; H02P 11/04; H02P 7/28; B60L 3/0069; H02H 3/16
See application file for complete search history.

(56) References Cited

U.S. PATENT DOCUMENTS 6,134,126 A * 10/2000 Ikekame ................. H02J 3/01
                                                                    307/105
9,401,669 B2 * 7/2016 Tsutsumi .............. H02P 29/025
9,696,743 B1 * 7/2017 Treichler .................. G05F 3/02
(Continued)

FOREIGN PATENT DOCUMENTS

JP    H02-088478 U1    7/1990
JP    H05-336759 A     12/1993
(Continued)

*Primary Examiner* — Gustavo A Rosario-Benitez
(74) *Attorney, Agent, or Firm* — RatnerPrestia

(57) ABSTRACT

A motor drive apparatus includes a converter configured to convert AC power inputted by an AC power supply to DC power and to output the same to a DC link, a DC link capacitor provided for the DC link, an inverter configured to convert the DC power in the DC link to AC power for driving a motor and to output the AC power, a DC voltage detection unit configured to detect a value of DC voltage applied across the DC link capacitor, an AC voltage detection unit configured to detect a peak value of AC voltage on an AC input side of the converter, and a leakage current detection unit configured to detect a leakage current caused by driving the motor, based on the value of DC voltage detected by the DC voltage detection unit and the peak value of AC voltage detected by the AC voltage detection unit.

4 Claims, 10 Drawing Sheets

(51) Int. Cl.
  *H02P 7/28*  (2016.01)
  *G01R 19/165*  (2006.01)

(56) References Cited

U.S. PATENT DOCUMENTS

| | | | | |
|---|---|---|---|---|
| 9,812,947 | B2* | 11/2017 | Yamamoto | G01R 31/00 |
| 9,859,821 | B2* | 1/2018 | Yamamoto | H02P 29/025 |
| 10,003,277 | B2 | 6/2018 | Taguchi et al. | |
| 2003/0112015 | A1* | 6/2003 | Takakamo | G01R 27/18 |
| | | | | 324/525 |
| 2006/0119997 | A1* | 6/2006 | Lee | H02H 3/335 |
| | | | | 361/42 |
| 2008/0150549 | A1* | 6/2008 | Horikoshi | G01R 31/12 |
| | | | | 324/557 |
| 2010/0244850 | A1* | 9/2010 | Yano | B60L 3/0046 |
| | | | | 324/510 |
| 2013/0134910 | A1* | 5/2013 | Iwashita | H02P 3/14 |
| | | | | 318/376 |
| 2013/0141957 | A1 | 6/2013 | Tanaka | |
| 2014/0306634 | A1* | 10/2014 | Sakai | H02P 27/085 |
| | | | | 318/490 |
| 2015/0009725 | A1* | 1/2015 | Taguchi | H02M 7/48 |
| | | | | 363/35 |
| 2015/0194922 | A1* | 7/2015 | Sato | G01R 31/346 |
| | | | | 318/504 |

FOREIGN PATENT DOCUMENTS

| | | |
|---|---|---|
| JP | 2001-218474 A | 8/2001 |
| JP | 2016073025 A | 5/2016 |
| JP | 2016082700 A | 5/2016 |
| JP | 2016214038 A | 12/2016 |
| WO | 2012020473 A1 | 2/2012 |

\* cited by examiner

MOTOR DRIVE APPARATUS TO DETECT OCCURRENCE OF LEAKAGE CURRENT

CROSS-REFERENCE TO RELATED APPLICATION

This application is a new U.S. patent application that claims benefit of Japanese Patent Application No. 2017-106829, filed May 30, 2017, the disclosure of this application is being incorporated herein by reference in its entirety for all purposes.

BACKGROUND OF THE INVENTION

1. Field of the Invention

The present invention relates to a motor drive apparatus to detect an occurrence of leakage current.

2. Description of the Related Art

Motor drive apparatuses to drive motors in machine tools, forming machinery, injection molding machines, industrial machinery, or various kinds of robots convert AC power supplied by an AC power supply to DC power by a converter and then convert the DC power to AC power by an inverter and use this AC power as the driving power for the motors respectively provided for drive axes.

In this type of motor drive apparatuses, when PWM switching control is performed on the inverters, the presence of stray capacitance with motors, motor power cables, and the like causes leakage current. It is important to address the problem of leakage current because leakage current may cause a malfunction or damage in the motor drive apparatus or its peripheral devices.

For example, Japanese Unexamined Patent Publication (Kokai) No. 2001-218474 discloses a method of detecting a ground fault of an output terminal of an inverter, wherein AC power supplied from a power source is rectified and converted to DC power by diodes and smoothed by a capacitor, producing a current through a DC bus, and the inverter outputs AC power by switching operations of a plurality of semiconductor bridges performed on the current, the method including comparing potential difference between an output terminal of the inverter for at least one phase and one of poles of the DC bus with a reference voltage when the inverter is not operating and thereby detecting a ground fault of the output terminal of the inverter.

For example, Japanese Unexamined Patent Publication (Kokai) No. 05-336759 discloses an inverter device including a converter unit to rectify an inputted AC current, a smoothing means for smoothing the rectified current, the smoothing means charged by a rectified power outputted by the converter unit, a current-restricting means for restricting an intensity of a charging current of the smoothing means, a PWM inverter unit to perform PWM control on the smoothed output from the smoothing means to supply AC current to a load, a voltage detection means for detecting a voltage across the smoothing means, and a determination means for determining whether or not a detection output of the voltage detection means is normal, based on whether the detection output is greater or smaller than a certain voltage.

For example, Japanese Unexamined Utility Model Publication (U. M. Kokai) No. 02-088478 discloses a drive control apparatus including a converter connected with an AC power supply to output a DC voltage, an inverter configured to convert the DC voltage outputted by the converter to AC voltage, a first switching means disposed between the AC power supply and the converter, a second switching means disposed in one of a positive output bus and a negative output bus of the converter, a resistor disposed in one of the positive output bus and the negative output bus, a detection means for detecting a voltage across the positive output bus and the negative output bus, a ground fault detection means for outputting a signal when the voltage outputted by the detection means exceeds a reference voltage, a first switching control means for opening the first switching means by the signal outputted by the ground fault detection means, and a second switching control means for closing the second switching means after a certain time has passed since the first switching means was closed.

SUMMARY OF INVENTION

To address the problem of leakage current, the leakage current needs to be measured. Leakage current is caused by a high-speed PWM switching control of inverters to supply motors with driving power under the presence of stray capacitance and accordingly leakage current has a very high frequency. Hence, it is very difficult to measure leakage current itself directly. Thus, technology of detecting easily and accurately the state of occurrence of leakage current is desired in the field of motor drive apparatuses.

According to one aspect of the present disclosure, a motor drive apparatus includes a converter configured to convert AC power inputted by an AC power supply to DC power and to output the DC power to a DC link, a DC link capacitor provided for the DC link, an inverter configured to convert the DC power in the DC link to AC power for driving a motor and to output the AC power, a DC voltage detection unit configured to detect a value of DC voltage applied across the DC link capacitor, an AC voltage detection unit configured to detect a peak value of AC voltage on an AC input side of the converter, and a leakage current detection unit configured to detect a leakage current caused by driving the motor, based on the value of DC voltage detected by the DC voltage detection unit and the peak value of AC voltage detected by the AC voltage detection unit.

BRIEF DESCRIPTION OF THE DRAWINGS

The present invention will be more clearly understood with reference to the following accompanying drawings.

DETAILED DESCRIPTION

Figure 1:
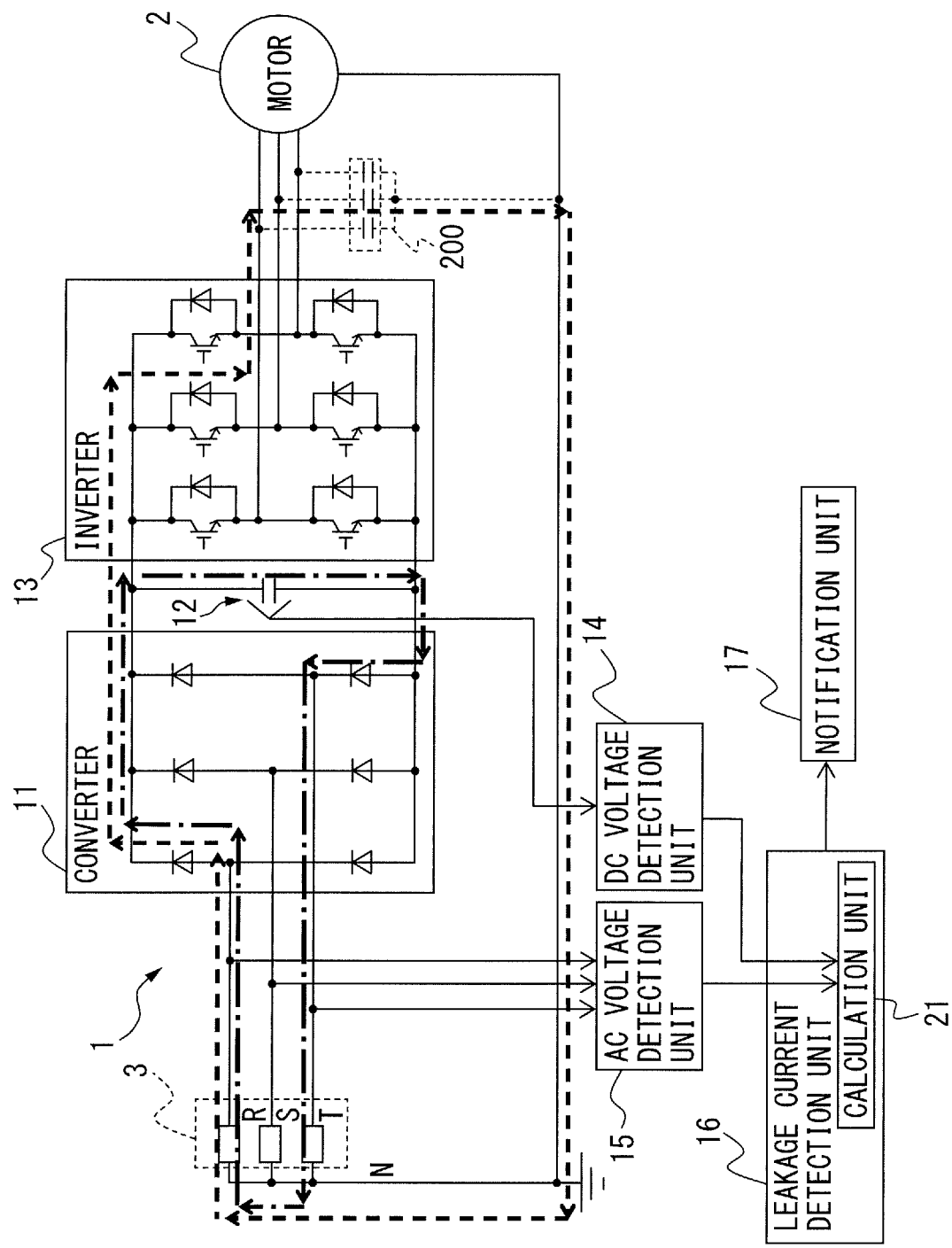
FIG. 1 illustrates a motor drive apparatus according to an embodiment.

With reference to the drawings, a motor drive apparatus to detect an occurrence of leakage current will now be described. In the drawings, like members are denoted by like reference numerals. Constituent features denoted by the same reference numerals in different drawings are to be understood to have the same functions. Further, the drawings are presented in various scales to aid the readers' understanding.

FIG. 1 illustrates a motor drive apparatus according to an embodiment. As an example, a case in which the motor drive apparatus 1 controls a three-phase AC motor 2 will be described although the present embodiment is not limited to a motor 2 of a particular type; the motor may be, for example, an induction motor or a synchronous motor. Further, the present embodiment is not limited to an AC power supply 3 or a motor 2 adapted to a particular number of phases; a single-phase power supply and a single-phase motor may be used. According to the embodiment illustrated in FIG. 1, the AC power supply 3 is a three-phase AC power supply and the motor 2 is a three-phase AC motor.

Before describing a servo motor drive apparatus 1 according to an embodiment, the drive control of the motor 2 will be described first. Similar to common motor drive apparatuses, the motor drive apparatus 1 controls an inverter 13 that performs power conversion between DC power of a DC link and AC power that is a driving power or a regenerative power of the motor 2. Based on the speed of (the rotor of) the motor 2 (speed feedback), current through the wiring of the motor 2 (current feedback), a designated torque command, an operation program for the motor 2, and the like, the motor drive apparatus 1 generates switching commands for controlling the speed, torque, or position of the rotor of the motor 2 in, for example, a superordinate controller (not illustrated). The power conversion operation by the inverter 13 is controlled in accordance with the switching commands generated by the motor drive apparatus 1.

As illustrated in FIG. 1, the motor drive apparatus 1 according to an embodiment includes a converter 11, a DC link capacitor 12, an inverter 13, a DC voltage detection unit 14, an AC voltage detection unit 15, a leakage current detection unit 16, and a notification unit 17. The phases of the three-phase AC power supply 3 are referred to as R-phase, S-phase, and T-phase and N denotes a ground point.

The converter 11 converts the AC power inputted by the AC power supply 3 to DC power and outputs the DC power to the DC link. The converter 11 may be, for example, a diode rectifying circuit, a 120-degree conduction rectifying circuit, a PWM switching control rectifying circuit with switching devices inside, or the like. When the converter 11 is a diode rectifying circuit, the converter 11 rectifies the AC current inputted by the AC power supply 3 and outputs a DC current to the DC link, which is on the DC side. When the converter 11 is a 120-degree conduction rectifying circuit or a PWM switching control rectifying circuit, the converter 11 can be realized as a power converter capable of converting AC and DC powers in both directions, converting the AC power inputted by the AC power supply 3 to DC power and outputting the DC power to the DC side as well as converting DC power in the DC link to AC power and returning the AC power to the AC power supply 3 when the motor slows down. When the converter 11 is a PWM switching control rectifying circuit, the converter 11 includes bridge circuits of switching devices and diodes in antiparallel connection. In this case, the switching devices may be, for example, IGBTs, thyristors, GTOs (Gate turn-off thyristors), transistors, or the like but the present embodiment is not limited to a particular type of switching devices and other types of switching devices may be used. Since the AC power supply 3 is a three-phase AC power supply according to the present embodiment, the converter 11 is configured as a three-phase bridge circuit; when the AC power supply 3 is a single-phase power supply, the converter 11 is configured as a single-phase bridge circuit.

The DC link capacitor (also referred to as a smoothing capacitor) 12 is provided for the DC link connecting the DC output side of the converter 11 with the DC input side of the inverter 13. The DC link capacitor 12 performs a function of reducing ripples of the DC output of the converter 11 and storing DC power in the DC link.

The inverter 13 is connected with the DC link and performs power conversion between DC power in the DC link and AC power that is driving power or regenerative power of the motor 2 as the switching devices are on-off controlled in accordance with the switching commands received from a superordinate controller (not illustrated). The inverter 13 includes bridge circuits of switching devices and diodes in antiparallel connection and the switching devices are on-off controlled by, for example, a PWM switching control method. The inverter 13 converts DC power supplied by the converter 11 through the DC link to AC power of a desired voltage and a desired frequency to drive the motor 2, by the switching operations of the switching devices therein in accordance with the switching commands received from the superordinate controller, and outputs the DC power (inversion operation). The motor 2 thus operates on the supplied AC power of variable voltage and variable frequency. Regenerative power is generated when the motor 2 slows down and the inverter 12 converts regenerative AC power generated by the motor 2 to DC power, by the switching operations of the switching devices therein in accordance with the switching commands received from the superordinate controller, and returns the DC power to the DC link (conversion operation). The switching devices may be, for example, IGBTs, thyristors, GTOs, transistors, or the like but the present embodiment is not limited to a particular type of switching devices and other types of switching devices may be used. According to the present embodiment, as the motor 2 connected to the motor drive apparatus 1 is a three-phase AC motor, the inverter 13 is configured as a three-phase bridge circuit; when the motor 2 is a single-phase motor, the inverter 13 is configured as a single-phase bridge circuit.

The DC voltage detection unit 14 detects a value of DC voltage applied across the DC link capacitor 12. The value of DC voltage detected by the DC voltage detection unit 14 is sent to the leakage current detection unit 16.

The AC voltage detection unit 15 detects a peak value of AC voltage on the AC input side of the converter 11. The peak value of an AC voltage is $\sqrt{2}$ times the effective value of the AC voltage. The peak value of AC voltage detected by the AC voltage detection unit 15 is sent to the leakage current detection unit 16.

The leakage current detection unit 16 detects an occurrence of leakage current caused by driving the motor, based on the value of DC voltage detected by the DC voltage detection unit 14 and the peak value of AC voltage detected by the AC voltage detection unit 15. More specifically, the leakage current detection unit 16 includes a calculation unit 21 configured to calculate the difference between the value of DC voltage detected by the DC voltage detection unit 14 and the peak value of AC voltage detected by the AC voltage detection unit 15. The leakage current detection unit 16 detects an occurrence of leakage current, based on the difference between the value of DC voltage and the peak value of AC voltage calculated by the calculation unit 21. The processing for detecting leakage current by the leakage current detection unit 16 will be described in detail later.

When the leakage current detection unit 16 has detected an occurrence of leakage current caused by driving the motor, the notification unit 17 notifies the user of the detection of leakage current. The notification unit 17 may be, for example, a display device of a personal computer, a mobile terminal, a touch panel, or the like or a display device mounted to a numerical control apparatus (not illustrated) provided in the motor drive apparatus 1. For example, information indicating that "a leakage current (that would cause a malfunction or damage) has occurred" or "no leakage current (that would cause a malfunction or damage) has occurred" is displayed on the display device in letters or pictures. Further, for example, the notification unit 17 may be realized as an audio device producing sound such as a speaker, a buzzer, or chimes and, for example, the audio device may be caused to produce sound when "a leakage current (that would cause a malfunction or damage) has occurred" and to produce no particular sound when "no leakage current (that would cause a malfunction or damage) has occurred". Further, the notification unit 17 may print information on a sheet of paper or the like by using a printer; for example, information indicating that "a leakage current (that would cause a malfunction or damage) has occurred" may be displayed with the time when the leakage current occurred. Further still, the notification unit 17 may be realized by combining these means as appropriate. In addition, data on the detection result outputted by the leakage current detection unit 16 may be stored in a storage device and further utilized for other purposes.

The detection result by the leakage current detection unit 16 allows the user of the motor drive apparatus 1 to learn easily and accurately the state of the occurrence of leakage current. For example, the user who has learned that "a leakage current (that would cause a malfunction or damage) has occurred" by means of the notification unit 17 can, for example, carry out an alteration in the design such as replacing a cable connected to the motor 2 or a cable connecting the AC power supply 3 with the motor drive apparatus 1 with a thicker cable. Further, a noise absorption circuit (not illustrated) may be provided in the motor drive apparatus 1 for absorbing noise generated on the AC input side of the converter 11 (i.e., between the AC power supply 3 and the converter 11). The user who has learned that "a leakage current (that would cause a malfunction or damage) has occurred" by means of the notification unit 17 can also carry out an alteration in the design such as replacing this noise absorption circuit with one having different noise absorption characteristics.

The above-described DC voltage detection unit 14, the AC voltage detection unit 15, the leakage current detection unit 16, and the notification unit 17 may be realized, for example, by a software program or a combination of electronic circuits of various kinds and a software program. When, for example, these units are realized by a software program, the above-described functions of these units are realized by causing a computer to operate in accordance with the software program or by causing the arithmetic processing unit provided in a numerical control apparatus connected with the motor drive apparatus 1 to execute this software program. Alternatively, the DC voltage detection unit 14, the AC voltage detection unit 15, the leakage current detection unit 16, and the notification unit 17 may be realized by a semiconductor integrated circuit with a software program written therein to carry out the functions of these units.

Further, for example, when a plurality of motor drive apparatuses 1 are provided and the control systems of the motor drive apparatuses 1 are connected via a communication network, detection results by the leakage current detection units 16 of the motor drive apparatuses 1 may be shared in a cloud server.

Further, for example, when a plurality of manufacturing cells including machine tools each including a motor drive apparatus 1 are connected via a communication network, detection results by the leakage current detection units 16 of the motor drive apparatuses 1 may be shared by cell controllers superordinate to the manufacturing cells or by a production control apparatus further superordinate to the cell controllers.

A manufacturing cell is a set of machine tools flexibly combined for product manufacturing. A manufacturing cell is formed by, for example, a plurality of machine tools or a plurality of kinds of machine tools, with no limitation on the number of machine tools in a manufacturing cell. For example, a manufacturing cell may be a manufacturing line in which a workpiece is machined by a plurality of machine tools in order and made into a finished product. Further, for example, a manufacturing cell may be a manufacturing line in which two or more articles (components) respectively machined by two or more machine tools are assembled by another machine tool in the manufacturing process into a finished article (product). Further, for example, two or more articles machined in two or more manufacturing cells may be assembled into a finished article (product). Manufacturing cells and cell controllers are communicably connected with each other via a communication network such as an intranet. Manufacturing cells are organized in a factory where the products are manufactured. In contrast, cell controllers may be provided in the factory where manufacturing cells are organized or in a building separate from the factory. For example, cell controllers may be provided in a separate building located on the same premise as the factory where manufacturing cells are organized.

A production control apparatus is provided superordinate to cell controllers. A production control apparatus is mutually communicably connected with cell controllers and gives commands to the cell controllers according to a production plan. A production control apparatus may be provided in an office remotely located from the factory. In such a case, the cell controllers and the production control apparatus are mutually communicably connected via a communication network such as the Internet.

In such a production system, a display device provided in a cell controller or in the production control apparatus may be used as the notification unit 17 and commanded to display the detection result that "a leakage current (that would cause a malfunction or damage) has occurred" or "no leakage current (that would cause a malfunction or damage) has occurred". Alternatively, instead of or together with the display device, an audio device serving as the notification unit 17 is used to produce an alarm sound or a buzz to notify detection results to the user. This allows operators or managers working in the factory to easily identify the motor drive apparatus 1 for which a design alteration is desired to reduce leakage current.

The processing for detecting leakage current by the leakage current detection unit 16 will now be described in detail.

Stray capacitance exists with the motor 2, the power supply cables for the motor, and the like. In FIG. 1, stray capacitance is denoted by reference numeral 200. When the switching devices in the inverter 13 perform high-speed switching operations to supply AC power to drive the motor, a leakage current flows through the AC power supply 3, the converter 11, the inverter 13, and the stray capacitance 200. In FIG. 1, thick dashed lines with arrows illustrate an example path through which flows a leakage current caused by driving the motor 2. The current path illustrated in FIG. 1 is simply an example and, in reality, the current path through which flows a leakage current caused by driving the motor 2 changes from moment to moment depending on the combinations of on/off states of the switching devices on the upper arm and the lower arm of the inverter 13 and other factors.

When a leakage current is caused by driving the motor 2, a part of the leakage current flows also to the DC link capacitor 12. In FIG. 1, thick long dashed short dashed lines with arrows illustrate an example path of a leakage current flowing through the DC link capacitor 12 when, for example, the leakage current caused by driving the motor 2 flows through the current path depicted by the thick dashed lines with arrows. When the leakage current caused by driving the motor 2 takes a different current path in the converter 11, the leakage current flowing into the DC link capacitor 12 accordingly takes a different current path in the converter 11. The flow of leakage current into the DC link capacitor 12 fluctuates the voltage applied across the DC link capacitor 12.

Figure 2A:
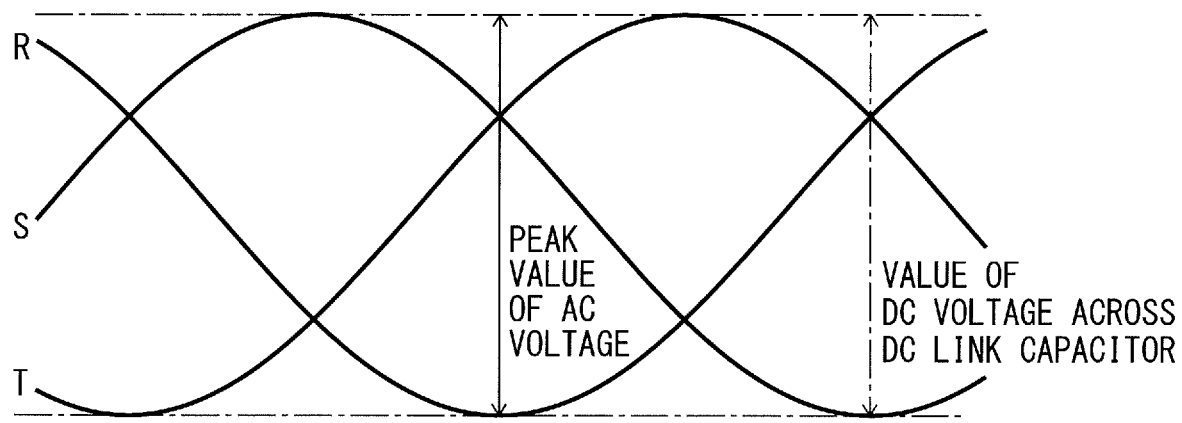
FIG. 2A is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters perform no switching operation.
Figure 2B:
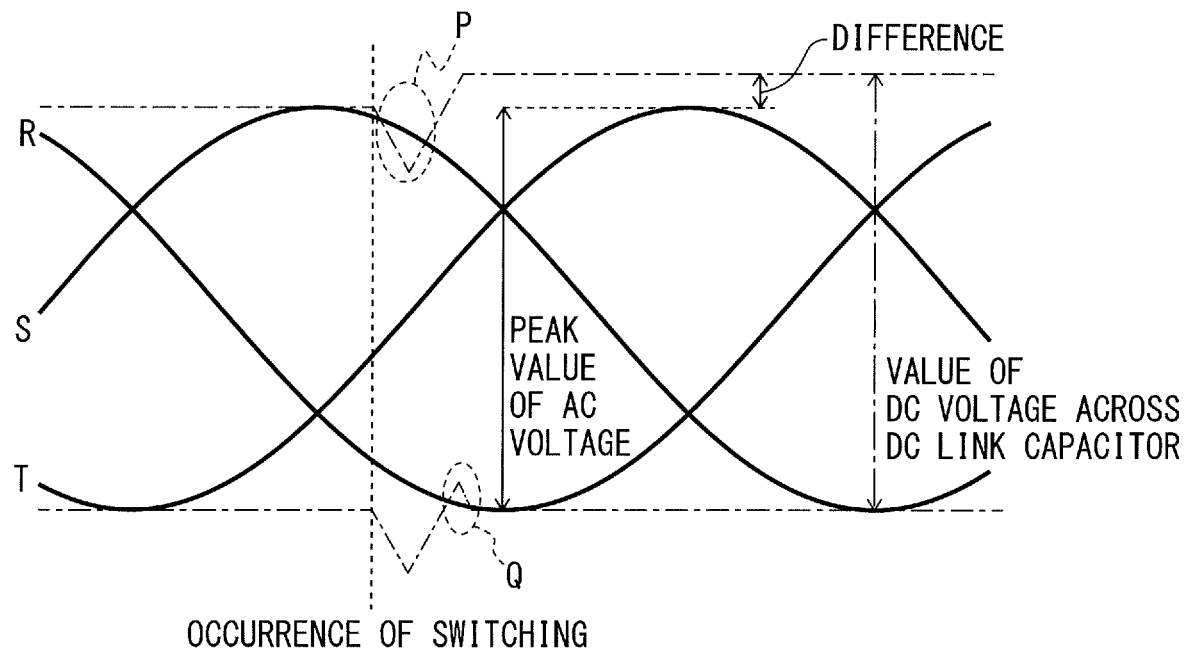
FIG. 2B is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters have performed switching operations.

FIG. 2A is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverter perform no switching operation. FIG. 2B is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverter have performed switching operations. In FIGS. 2A and 2B, three-phase AC voltage waveforms on the AC input side of the converter 11 are depicted by continuous lines and DC voltage waveforms across the DC link capacitor 12 are depicted by long dashed short dashed lines.

In the motor drive apparatus 1, when the converter 11 converts the AC power inputted by the three-phase (R-phase, S-phase, and T-phase) AC power supply 3 to DC power and outputs the DC power to the DC link and the inverter 13 performs no power conversion operation, with the switching devices therein performing no switching operation, the value of the DC voltage outputted by the converter 11 to the DC link is equal to the peak value of AC voltage ($\sqrt{2}$ times the effective value of AC voltage) on the AC input side as illustrated in FIG. 2A. When the inverter 13 subsequently performs power conversion operation, with the switching devices therein performing switching operations, a leakage current flows through the AC power supply 3, the converter 11, the inverter 13, and the stray capacitance 200 and a part of the leakage current flows through the DC link capacitor 12. This fluctuates the voltage applied across the DC link capacitor 12 as illustrated in FIG. 2B. In other words, the positive-side DC potential and the negative-side DC potential of the DC link relative to the ground potential fluctuate. Note that, as the DC link capacitor 12 generally has a very large capacitance, the amplitude of the voltage fluctuation is not so great. As illustrated in FIG. 2B, when the voltage applied across the DC link capacitor 12 fluctuates, the peak values of the AC voltage exceed the positive-side DC potential and the negative-side DC potential of the DC link capacitor 12 at certain timings (P and Q in the drawings), when a current occurs, which flows through the AC power supply 3 into the DC link capacitor 12. The current flowing into the DC link capacitor 12 further charges the DC link capacitor 12, resulting in a fluctuation in the voltage applied across the DC link capacitor 12. The relation between the fluctuation of the voltage applied across the DC link capacitor 12 and leakage current is described further in detail in the following.

Figure 3:
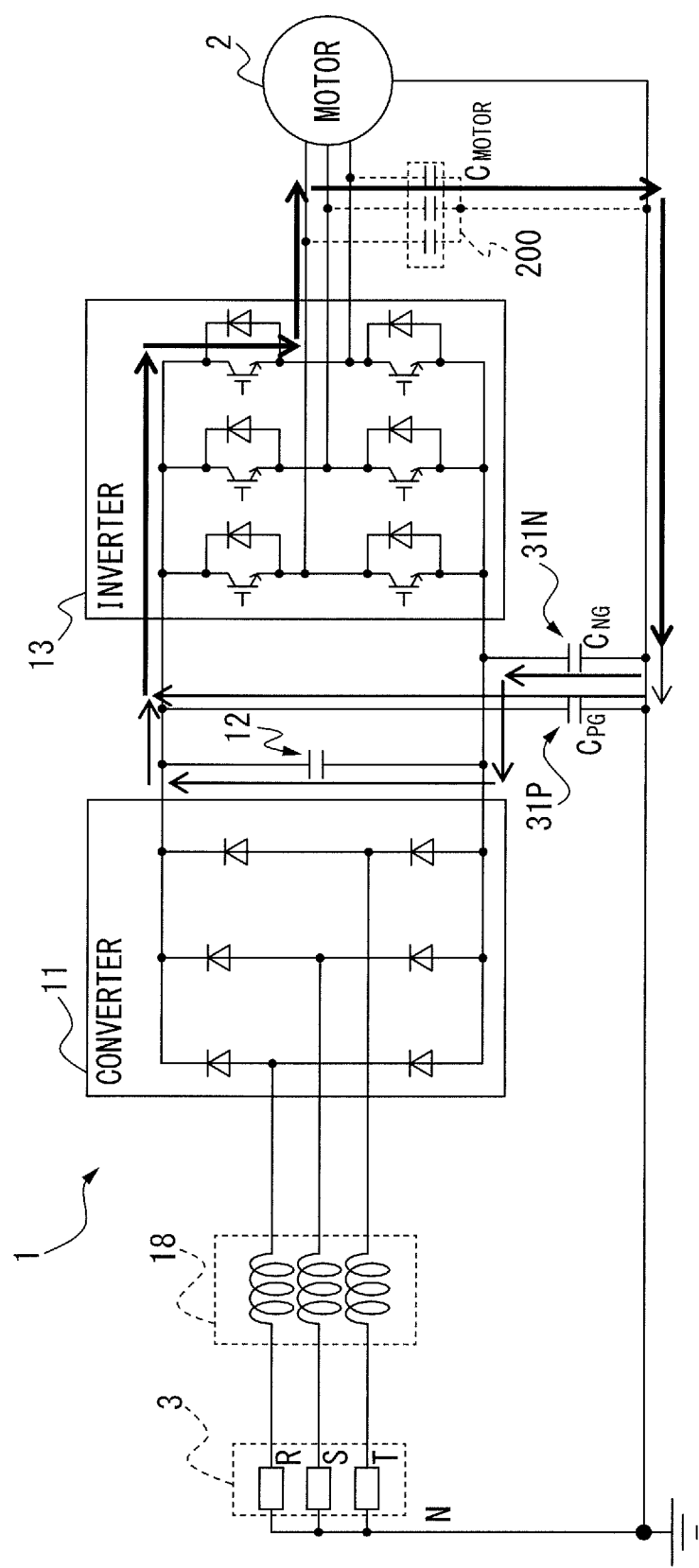
FIG. 3 is a (first) diagram for explaining a flow of current at the time of a voltage fluctuation across the DC link capacitor caused by an occurrence of leakage current.
Figure 4:
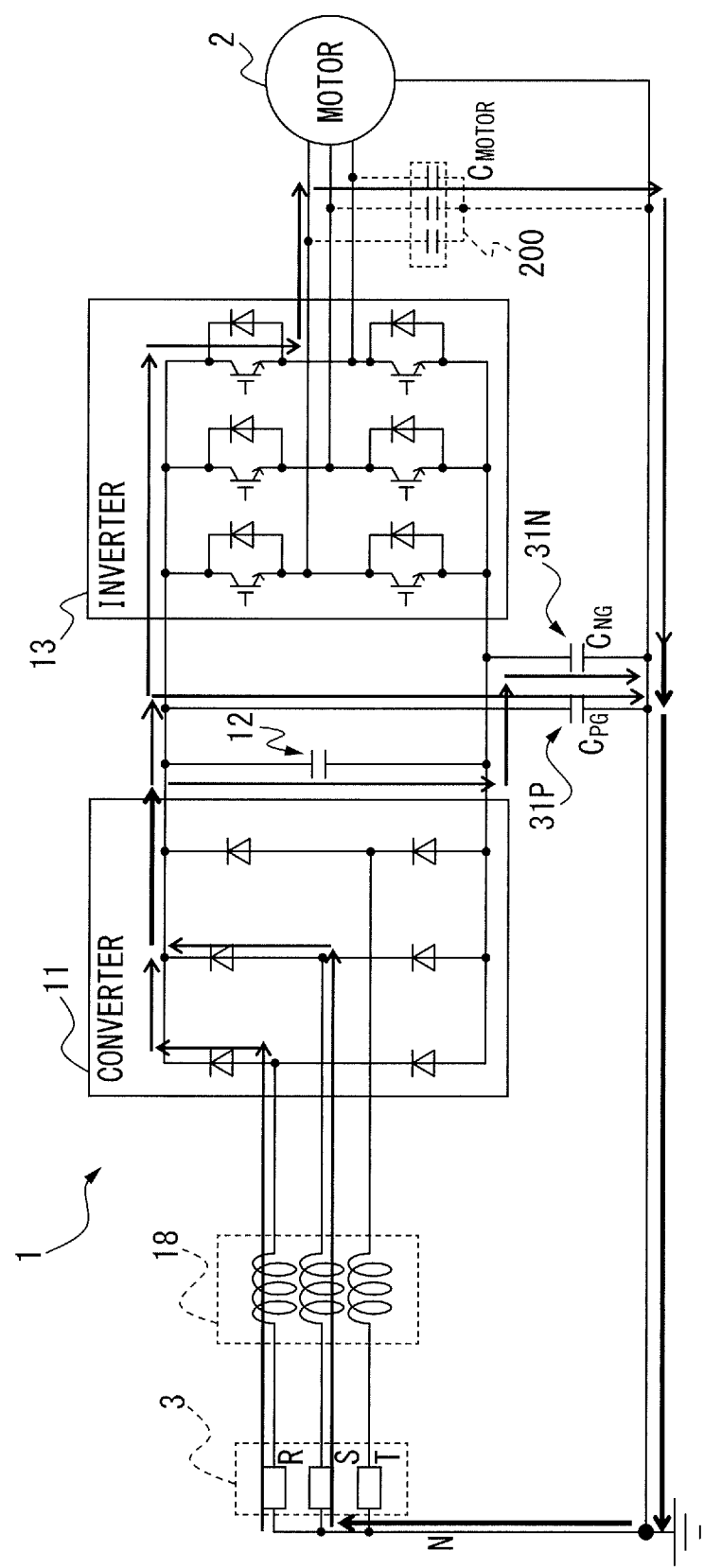
FIG. 4 is a (second) diagram for explaining a flow of current at the time of a voltage fluctuation across the DC link capacitor caused by an occurrence of leakage current.
Figure 5:
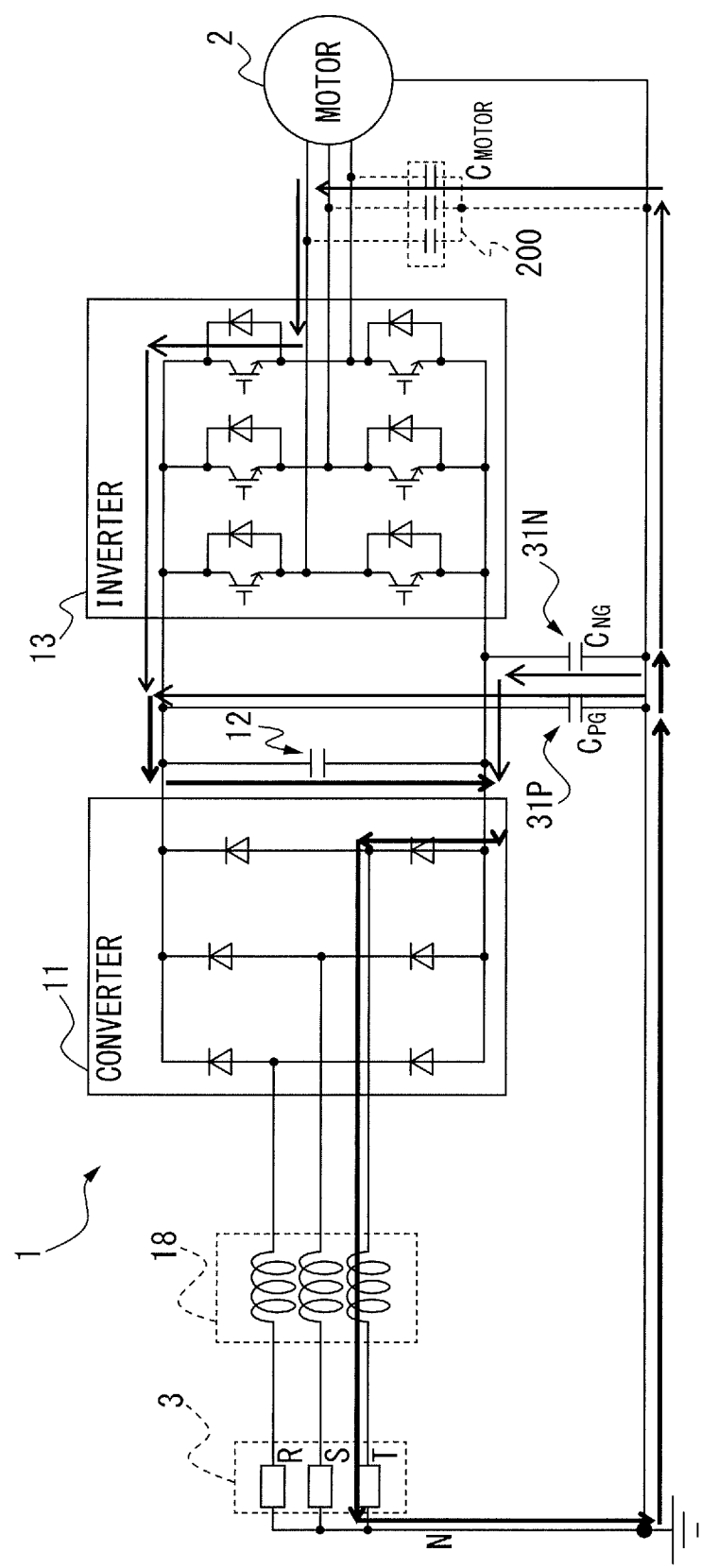
FIG. 5 is a (third) diagram for explaining a flow of current at the time of a voltage fluctuation across the DC link capacitor caused by an occurrence of leakage current.

FIGS. 3 to 5 are diagrams for explaining a flow of current at the time of a voltage fluctuation across the DC link capacitor caused by an occurrence of leakage current. Generally, in the motor drive apparatus 1, AC reactors 18 are provided on the AC input side of the converter 11. Further, Y capacitors (line bypass capacitors) may be connected between the positive-side DC potential and ground and between the negative-side DC potential of the DC link and ground mainly for the purpose of reducing noise. In the examples illustrated in FIGS. 3 to 5, a Y capacitor 31P of capacitance $C_{PG}$ is connected between the positive-side DC potential of the DC link and ground and a Y capacitor 31N of capacitance $C_{NG}$ is connected between the negative-side DC potential of the DC link and ground. $C_{MOTOR}$ is the capacitance of the stray capacitance 200.

When the switching devices in the inverter 13 perform high-speed switching operations to supply AC power to drive the motor, a leakage current flows through the AC power supply 3, the converter 11, the inverter 13, and the stray capacitance 200. This leakage current also flows through DC capacitor 12 and, as illustrated in FIG. 3, fluctuates the voltage applied across the DC link capacitor 12, i.e., fluctuates the positive-side DC potential and the negative-side DC potential of the DC link relative to the ground potential. When the positive-side DC potential and the negative-side DC potential of the DC link relative to the ground potential fluctuate, a voltage depending on the amplitude of this fluctuation is applied to the AC reactors 18, producing energy in the AC reactors 18, resulting in current flows as illustrated in FIG. 4, and the currents flow into the DC link capacitor 12 and the Y capacitors 31P and 31N. By the effects of the inductance of the Y capacitors 31P and 31N, the positive-side DC potential and the negative-side DC potential of the DC link relative to the ground potential increase, resulting in current flows as illustrated in FIG. 5, which are in reverse direction to the current flows in FIG. 4.

As described above, the positive-side DC potential and the negative-side DC potential of the DC link relative to the ground potential fluctuate due to the transfer of charges between the DC link capacitor 12, the stray capacitance 200, and Y capacitors 31P and 31N during the high-speed switching operations of the switching devices in the inverter 13. However, the voltage applied across the DC link capacitor 12 $V_{PN}$ changes very little as the capacitance of the DC link capacitor 12 is far greater than the capacitance of the Y capacitor 31P. Therefore, by approximation, the transfer of charges can be considered to take place between the stray capacitance 200 and the Y capacitors 31P and 31N. When it is assumed that charges are ideally transferred between the stray capacitance 200 and the Y capacitors 31P and 31N, then the charge of the stray capacitance 200 is equal to the discharge of the Y capacitors 31P and 31N. Thus, equation 1 holds where $V_{FALL}$ is the amplitude of voltage fluctuation in the positive-side DC potential or the negative-side DC potential of the DC link relative to the ground potential.

$$C_{MOTOR}(V_{PN}-V_{FALL})=(C_{PG}+C_{NG})V_{FALL} \quad (1)$$

Equation 1 is rearranged as equation 2.

$$V_{FALL} = \frac{C_{MOTOR}V_{PN}}{C_{MOTOR}+C_{PG}+C_{NG}} \quad (2)$$

As can be seen from equation 2, the amplitude of voltage fluctuation $V_{FALL}$ of the positive-side DC potential or the negative-side DC potential of the DC link relative to the ground potential depends on the capacitance $C_{MOTOR}$ of the stray capacitance 200, the capacitance $C_{PG}$ of the Y capacitor 31P, and the capacitance $C_{NG}$ of the Y capacitor 31N. In other words, due to the presence of stray capacitance 200, a leakage current occurs during the high-speed switching operations of the switching devices in the inverter 13 and fluctuates the positive-side DC potential or the negative-side DC potential of the DC link relative to the ground potential.

As described above, when the converter 11 converts the AC power inputted by the three-phase AC power supply 3 to DC power and outputs the DC power to the DC link and the inverter 13 performs no power conversion operation, with the switching devices therein performing no switching operation, the value of the DC voltage outputted by the converter 11 to the DC link side equals to the peak value of AC voltage on the AC input side as illustrated in FIG. 2A. In other words, the value of DC voltage detected by the DC voltage detection unit 14 (i.e., the value of DC voltage applied across the DC link capacitor 12) equals to the peak value of AC voltage detected by the AC voltage detection unit 15 in this case. In contrast, when the switching devices in the inverter 13 perform high-speed switching operations, a leakage current occurs and this leakage current fluctuates the voltage applied across the DC link capacitor 12 (FIG. 2B). In this case, the value of DC voltage detected by the DC voltage detection unit 14 (i.e., the value of DC voltage applied across the DC link capacitor 12) increases and exceeds the peak value of AC voltage detected by the AC voltage detection unit 15 and, as a result, the value of DC voltage differs from the peak value of AC voltage. Thus, according to the present embodiment, the calculation unit 21 in the leakage current detection unit 16 calculates the difference between the value of DC voltage detected by the DC voltage detection unit 14 and the peak value of AC voltage detected by the AC voltage detection unit 15 and an occurrence of leakage current is detected, based on the difference.

The difference between the value of DC voltage detected by the DC voltage detection unit 14 and the peak value of AC voltage detected by the AC voltage detection unit 15 is proportional to the intensity of the leakage current. This will be explained with reference to FIG. 6.

Figure 6:
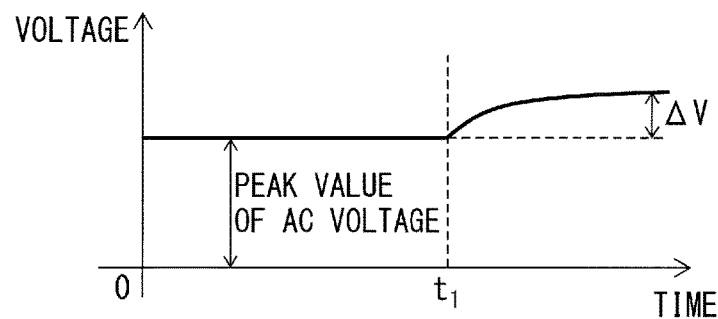
FIG. 6 is a diagram schematically illustrating a voltage across the DC link capacitor caused by an occurrence of leakage current.

FIG. 6 is a diagram schematically illustrating a voltage across the DC link capacitor caused by an occurrence of leakage current. In the period till time $t_1$, during which the converter 11 converts the AC power inputted by the three-phase AC power supply 3 to DC power and outputs the DC power to the DC link and the switching devices in the inverter 13 perform no switching operation, the value of DC voltage outputted by the converter 11 to the DC link equals to the peak value of AC voltage on the AC input side. Subsequently, when the inverter 13 performs power conversion operation, with the switching devices therein performing switching operations, a leakage current flows through the AC power supply 3, the converter 11, the inverter 13 and the stray capacitance 200 and a part of the leakage current flows into the DC link capacitor 12. As a result, the voltage across the DC link capacitor 12 starts to increase and the value of DC voltage detected by the DC voltage detection unit 14 starts to differ from the peak value of AC voltage detected by the AC voltage detection unit 15. The voltage across the DC link capacitor 12, into which leakage current flows, becomes constant after having increased to a certain level. Equation 3 holds wherein $\Delta V$ is the increase in the voltage across the DC link capacitor 12, i is the leakage current flowing into the DC link capacitor 12, Q is the increase in the charge of the DC link capacitor 12, and C is the capacitance of the DC link capacitor 12. In equation 3, t is a period of time from the point in time when the voltage across the DC link capacitor 12 starts to increase (i.e., from the point in time $t_1$ when the switching operations by the switching devices in the inverter 13 start) to the point in time when the voltage of the DC link capacitor 12 reaches an approximately constant value after having made an increase.

$$Q=C\Delta V \quad (3)$$

Equation 3 is rearranged as equation 4.

$$\Delta V = \frac{Q}{C} = \frac{i}{C}t \quad (4)$$

As can be seen from equation 4, the voltage increases $\Delta V$ across the DC link capacitor 12 can be expressed by time integration of the leakage current i flowing into the DC link capacitor 12. Equation 4 is rearranged as equation 5.

$$i = \frac{C\Delta V}{t} \quad (5)$$

As described above with reference to FIG. 2B, a part (i.e., i) of the leakage current flowing through the stray capacitance 200, the AC power supply 3, and the converter 11 flows into the DC link capacitor 12 and the rest flows through the inverter 13. The ratio of the leakage current i flowing into the DC link capacitor 12 and the leakage current flowing through the inverter 13 is approximately the inverse of the impedance ratio between the DC link capacitor 12 and the inverter 13. In other words, the leakage current I flowing through the stray capacitance 200, the AC power supply 3, and the converter 11 and the leakage current i flowing into the DC link capacitor 12 are in a proportional relation. Equation 6 holds where K is a proportionality coefficient.

$$I=Ki \qquad (6)$$

By substituting equation 5 into equation 6, equation 7 is obtained.

$$I = \frac{KC\Delta V}{t} \qquad (7)$$

As can be seen from equation 7, the leakage current I flowing through the stray capacitance 200, the AC power supply 3, and the converter 11 is proportional to the voltage increase across the DC link capacitor 12. The voltage across the DC link capacitor 12 caused by the leakage current flowing into it reaches saturation after having increased to a certain level and the value of DC voltage detected by the DC voltage detection unit 14 differs from the peak value of AC voltage detected by the AC voltage detection unit 15. According to the present embodiment, the calculation unit 21 in the leakage current detection unit 16 calculates the difference between the value of DC voltage detected by the DC voltage detection unit 14 and the peak value of AC voltage detected by the AC voltage detection unit 15 and an occurrence of leakage current is detected, based on the difference. In equation 7, the capacitance C of the DC link capacitor 12, the difference $\Delta V$ between the value of DC voltage detected by the DC voltage detection unit 14 and the peak value of AC voltage detected by the AC voltage detection unit 15 (voltage increase across the DC link capacitor 12), and time t from the point in time when the voltage across the DC link capacitor 12 starts to increase to the point in time when the voltage across the DC link capacitor 12 becomes approximately constant after having made an increase are all measurable parameters. The proportionality coefficient K in equation 7 is a parameter dependent on the wiring impedances of the power line and ground line of the motor drive apparatus 1 and the like.

FIG. 7 to FIG. 10 illustrate results of simulation analysis conducted on the series of operations described above with reference to FIGS. 3 to 6. The simulation was conducted in a setting such that the switching devices in the inverter 13 perform switching operations at certain time intervals while the converter 11 converting the AC power inputted by the AC power supply 3 to DC power and outputting the DC power to the DC link. The capacitance $C_{MOTOR}$ of the stray capacitance 200 was set to be smaller than the total capacitance ($C_{PG}+C_{NG}$) of the Y capacitors 31P and 31N.

Figure 7:
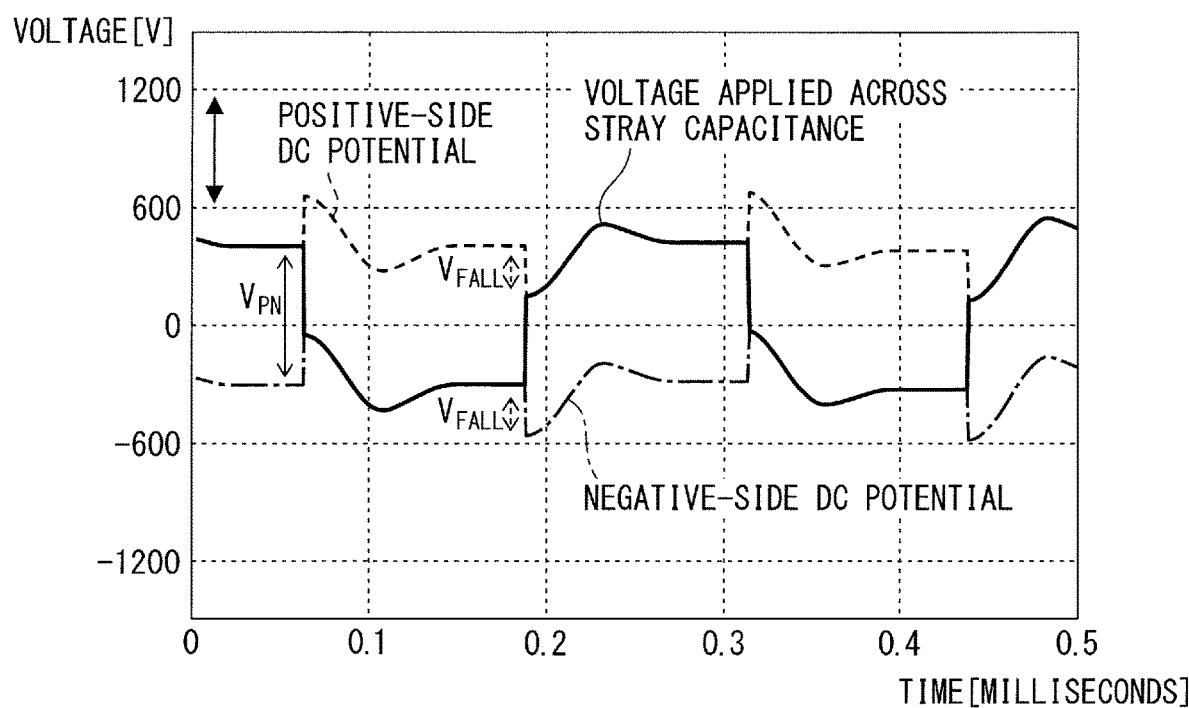
FIG. 7 illustrates a result of simulation of a voltage fluctuation across the DC link capacitor caused by an occurrence of leakage current.

FIG. 7 illustrates a result of simulation of a voltage fluctuation across the DC link capacitor caused by an occurrence of leakage current. In FIG. 7, dashed lines denote the positive-side DC potential of the DC link relative to the ground potential, long dashed short dashed lines denote the negative-side DC potential of the DC link relative to the ground potential, and continuous lines denote the voltage applied across the stray capacitance 200. As can be seen from FIG. 7, when no AC driving current is flowing through the motor 2, the positive-side DC potential or the negative-side DC potential of the DC link relative to the ground potential is applied across the stray capacitance 200. When, for example, the switching devices for all three phases on the lower arm of the inverter 13 are on and the switching devices for all three phases on the upper arm are off, the negative-side DC potential of the DC link relative to the ground potential is applied across the stray capacitance 200. When the operation of the switching devices shifts from the state in which the switching devices for all three phases on the lower arm of the inverter 13 are on and the switching devices for all three phases on the upper arm are off to the state in which the switching devices for all three phases on the lower arm are off and the switching devices for all three phases on the upper arm are on, the voltage applied across the stray capacitance 200 changes from the negative-side DC potential to the positive-side DC potential of the DC link relative to the ground potential, which appears in the simulation result illustrated in FIG. 7. During this change the stray capacitance 200 accumulates a charge, which is owing to the discharge by the DC link capacitor 12 and the Y capacitor 31P. Note that the capacitance of the DC link capacitor 12 is far greater than the capacitance of the Y capacitor 31P and the voltage applied across the DC link capacitor 12 $V_{PN}$ changes little. Accordingly, the transfer of charges between the stray capacitance 200 and the Y capacitors 31P and 31N appears as a phenomenon that the positive-side DC potential and the negative-side DC potential of the DC link relative to the ground potential change in the same direction by the same amount, as illustrated in FIG. 7.

Figure 8:
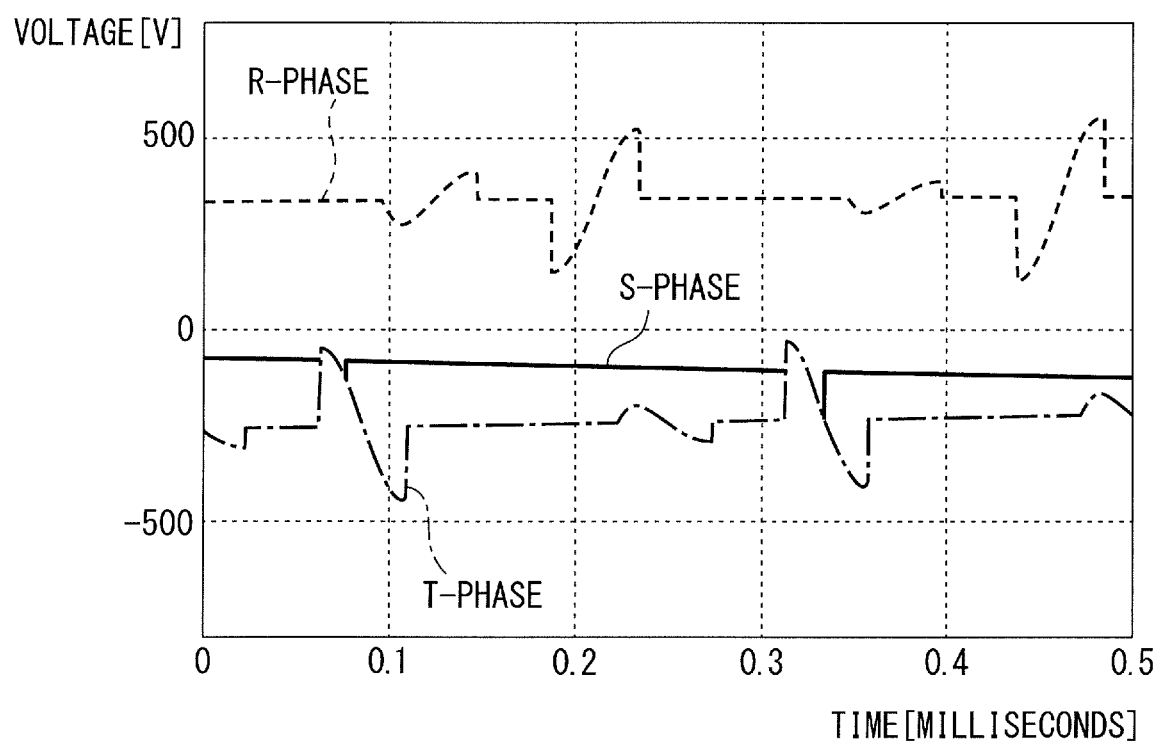
FIG. 8 illustrates a result of simulation of fluctuations in AC voltage on the AC input side of the converter caused by an occurrence of leakage current.

FIG. 8 illustrates a result of simulation of fluctuations in AC voltage on the AC input side of the converter caused by an occurrence of leakage current. In FIG. 8, dashed lines denote the R-phase AC voltage on the AC input side of the converter 11, continuous lines denote the S-phase AC voltage on the AC input side of the converter 11, and long dashed short dashed lines denote T-phase AC voltage on the AC input side of the converter 11. As described above with reference to FIG. 5, when the positive-side DC potential and the negative-side DC potential of the DC link relative to the ground potential fluctuate, a voltage is applied across the AC reactors 18 depending on the amplitude of fluctuation, and this appears as fluctuations in R-phase, S-phase, and T-phase AC voltages in the simulation result illustrated in FIG. 8.

Figure 9:
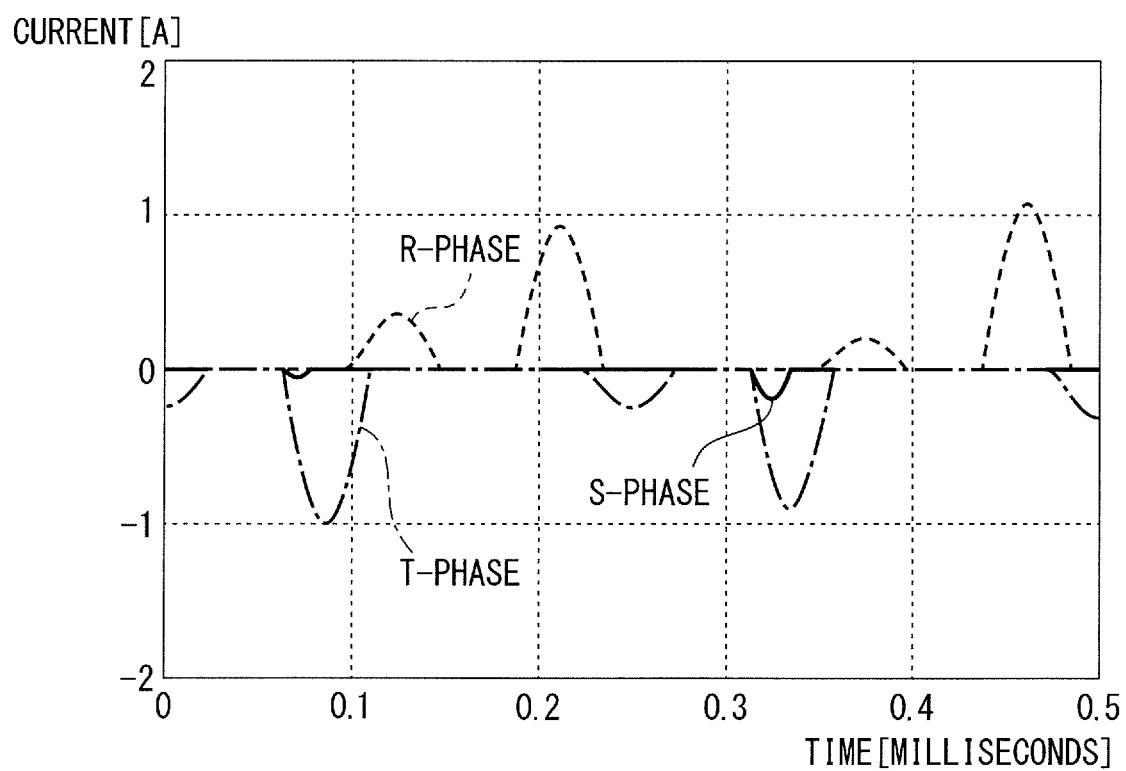
FIG. 9 illustrates a result of simulation of flows of AC current caused by an occurrence of leakage current and flowing through AC reactors on the AC input side of the converter.

FIG. 9 illustrates a result of simulation of flows of AC current caused by an occurrence of leakage current and flowing through AC reactors on the AC input side of the converter. In FIG. 9, dashed lines denote the AC current flowing through the R-phase AC reactor 18 on the AC input side of the converter 11, continuous lines denote the AC current flowing through the S-phase AC reactor 18 on the AC input side of the converter 11, and long dashed short dashed lines denote the AC current flowing through the T-phase AC reactor 18 on the AC input side of the converter 11. The voltage applied across the AC reactors 18 depending on the amplitude of fluctuation in the positive-side DC potential and the negative-side DC potential of the DC link relative to the ground potential, produces energy in the AC reactors 18 and it can be seen from FIG. 9 there are currents through the R-phase, S-phase, and T-phase AC reactors 18. It can be also seen that, as described above with reference to FIG. 6, there are currents flowing in reverse direction by the effects of the inductance of the Y capacitors 31P and 31N.

Figure 10:
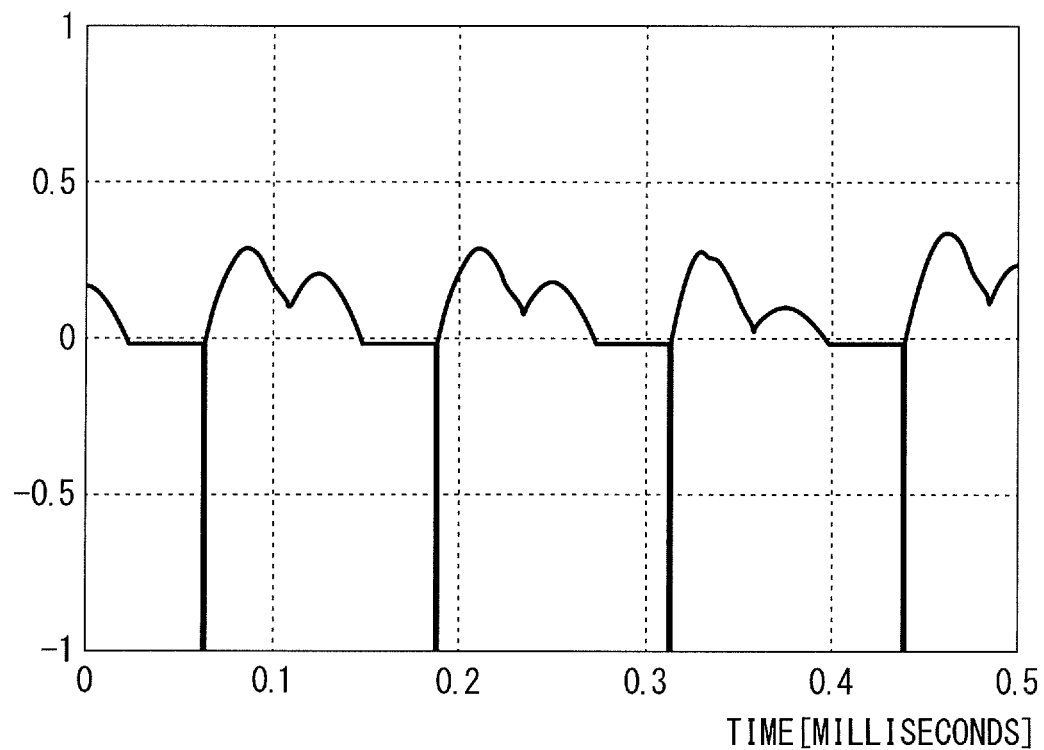
FIG. 10 illustrates a result of simulation of the quantity of charge caused by an occurrence of leakage current and flowing into the DC link capacitor.

FIG. 10 illustrates a result of simulation of the quantity of charge caused by an occurrence of leakage current and flowing into the DC link capacitor. AC currents flow through the R-phase, S-phase, and T-phase AC reactors 18 owing to the voltage applied across the AC reactors 18 depending on the amplitude of fluctuation in the positive-side DC potential and the negative-side DC potential of the DC link relative to the ground potential, and these AC currents are converted (rectified) by the converter 11 to DC currents and it can be seen from FIG. 10 that these currents appear as charges flowing into the DC link capacitor 12.

As described above with reference to FIGS. 3 to 10, high-speed switching operations by the switching devices in the inverter 13 under the presence of stray capacitance 200 cause a leakage current and this leakage current fluctuates the voltage applied across the DC link capacitor 12, i.e., fluctuates the positive-side DC potential and the negative-side DC potential of the DC link relative to the ground potential.

Driving a motor generally causes a leakage current of a certain intensity, large or small. The larger the leakage current caused by driving a motor, the more likely the leakage current is to cause a malfunction or damage in the motor drive apparatus or its peripheral devices. A leakage current may also be not so large as to cause a malfunction or damage in the motor drive apparatus or its peripheral devices. Therefore, a threshold value for detecting leakage current may be set and used for distinguishing "an occurrence of leakage current that would cause a malfunction or damage" from "an occurrence of leakage current that would cause no malfunction or damage".

Figure 11:
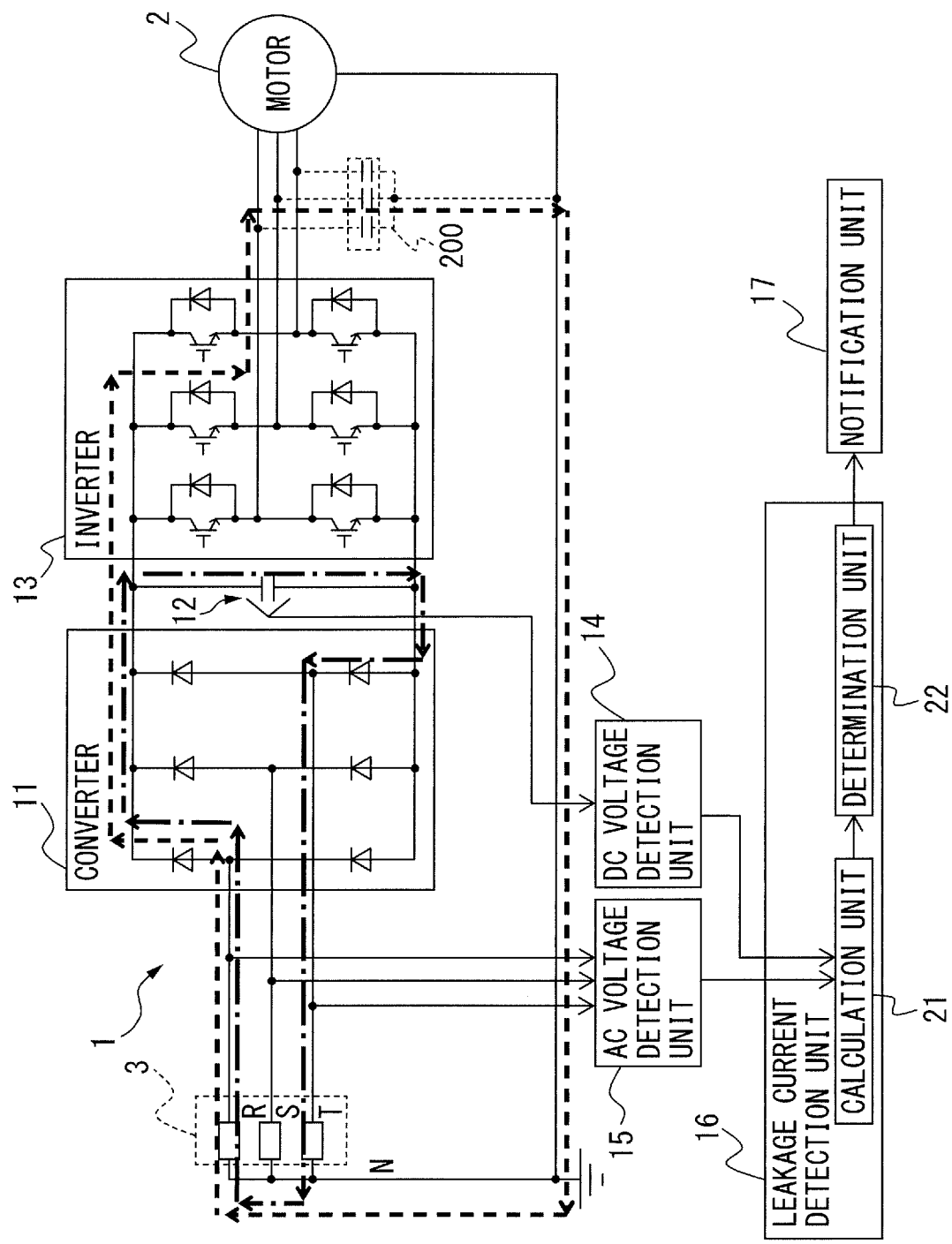
FIG. 11 illustrates a motor drive apparatus according to a modified example of an embodiment.

FIG. 11 illustrates a motor drive apparatus according to a modified example of an embodiment. According to this modified example, the motor drive apparatus 1 illustrated in FIG. 1 further includes a determination unit 22 in the leakage current detection unit 16 configured to determine that a leakage current caused by driving a motor has occurred when the difference calculated by the calculation unit 21 exceeds a threshold value set in advance. The threshold value to be used for the determination processing by the determination unit 22 in the leakage current detection unit 16 is preferably set at a value smaller than a value of leakage current that would cause a malfunction or damage in the motor drive apparatus 1 or its peripheral devices, with a certain allowance for safety. The determination unit 22 determines that a leakage current caused by driving a motor (that would cause a malfunction or damage) has occurred when the difference calculated by the calculation unit 21 exceeds the threshold value, and determines that no leakage current caused by driving a motor (that would cause a malfunction or damage) has occurred when the difference calculated by the calculation unit 21 does not exceed the threshold value. The result of determination is sent to the notification unit 17. The notification unit 17 notifies the user that "a leakage current that would cause a malfunction or damage has occurred" or "no leakage current that would cause a malfunction or damage has occurred". For example, the user who has learned by means of the notification unit 17 that "a leakage current that would cause a malfunction or damage has occurred" can, for example, carry out an alteration in the design such as replacing a cable connected to the motor 2 or a cable connecting the AC power supply 3 with the motor drive apparatus 1 with a thicker cable or replacing a noise absorption circuit.

According to one aspect of the present disclosure, a motor drive apparatus that enables an easy and accurate detection of the state of occurrence of leakage current can be provided.

The invention claimed is:

1. A motor drive apparatus comprising:
   a converter configured to convert AC power inputted by an AC power supply to DC power and to output the DC power to a DC link;
   a DC link capacitor provided for the DC link;
   an inverter configured to convert the DC power in the DC link to AC power for driving a motor and to output the AC power;
   a DC voltage detection unit configured to detect a value of DC voltage applied across the DC link capacitor;
   an AC voltage detection unit configured to detect a peak value of AC voltage on an AC input side of the converter; and
   a leakage current detection unit configured to detect a leakage current caused by driving the motor, based on a calculated difference between the value of DC voltage detected by the DC voltage detection unit and the peak value of AC voltage detected by the AC voltage detection unit.

2. The motor drive apparatus according to claim 1, wherein the leakage current detection unit:
   comprises a calculation unit configured to calculate a difference between the value of DC voltage detected by the DC voltage detection unit and the peak value of AC voltage detected by the AC voltage detection unit, and
   detects an occurrence of the leakage current caused by driving the motor, based on the difference calculated by the calculation unit.

3. The motor drive apparatus according to claim 2, wherein the leakage current detection unit further comprises a determination unit configured to determine that the leakage current caused by driving the motor has occurred when the difference calculated by the calculation unit exceeds a threshold value set in advance.

4. The motor drive apparatus according to claim 1, further comprising a notification unit configured to notify that the leakage current has occurred when the leakage current detection unit has detected the leakage current caused by driving the motor.

* * * * *